United States Patent [19]
Violette et al.

[11] Patent Number: 5,696,025
[45] Date of Patent: Dec. 9, 1997

[54] METHOD OF FORMING GUARD RINGED SCHOTTKY DIODE

[75] Inventors: Michael P. Violette; Fernando Gonzalez, both of Boise, Id.

[73] Assignee: Micron Technology, Inc., Boise, Id.

[21] Appl. No.: 597,479

[22] Filed: Feb. 2, 1996

[51] Int. Cl.⁶ ................................. H01L 21/28
[52] U.S. Cl. .................. 437/175; 437/176; 437/177; 437/162; 437/193; 437/203
[58] Field of Search .................... 437/175, 176, 437/177, 178, 179, 162, 160, 187, 193, 195, 203; 148/139, 140; 257/484

[56] References Cited

U.S. PATENT DOCUMENTS

| | | | |
|---|---|---|---|
| 4,414,737 | 11/1983 | Menjo et al. | 437/162 |
| 4,691,435 | 9/1987 | Anantha et al. | 437/175 |
| 4,874,714 | 10/1989 | Eklund | 437/39 |
| 4,875,082 | 10/1989 | Bredthauer | 357/15 |
| 5,179,034 | 1/1993 | Mori et al. | 437/160 |
| 5,418,185 | 5/1995 | Todd et al. | 437/175 |
| 5,583,348 | 12/1996 | Sundaram | 437/203 |

FOREIGN PATENT DOCUMENTS

| | | |
|---|---|---|
| 57-128076 | 8/1982 | Japan. |
| 57-128077 | 8/1982 | Japan. |
| 63-138771 | 6/1988 | Japan. |
| 02-246339 | 10/1990 | Japan. |
| 03-227066 | 10/1991 | Japan. |

OTHER PUBLICATIONS

K.D. Beyer, "Self–Aligned Guard Ring Formation For Schottky Barrier Diodes Using Boron–Doped Oxides", IBM Tech. Discl. Bull., vol. 26, No. 3A, pp. 1180–1181, Aug. 1983.

*Primary Examiner*—John Niebling
*Assistant Examiner*—Thomas G. Bilodeau
*Attorney, Agent, or Firm*—Kirkpatrick & Lockhart LLP

[57] ABSTRACT

A method of forming a guard ring for a Schottky diode is comprised of the steps of forming anode and cathode contact openings. A layer of doped material is deposited and etched to create spacers in the anode and cathode openings. The outdiffusion of dopant from the spacers is controlled to form a guard ring in the well without affecting the active area. The method can be used to create a p-type guard ring in an n-well or an n-type guard ring in a p-well. A Schottky diode constructed according to the method is also disclosed.

17 Claims, 4 Drawing Sheets

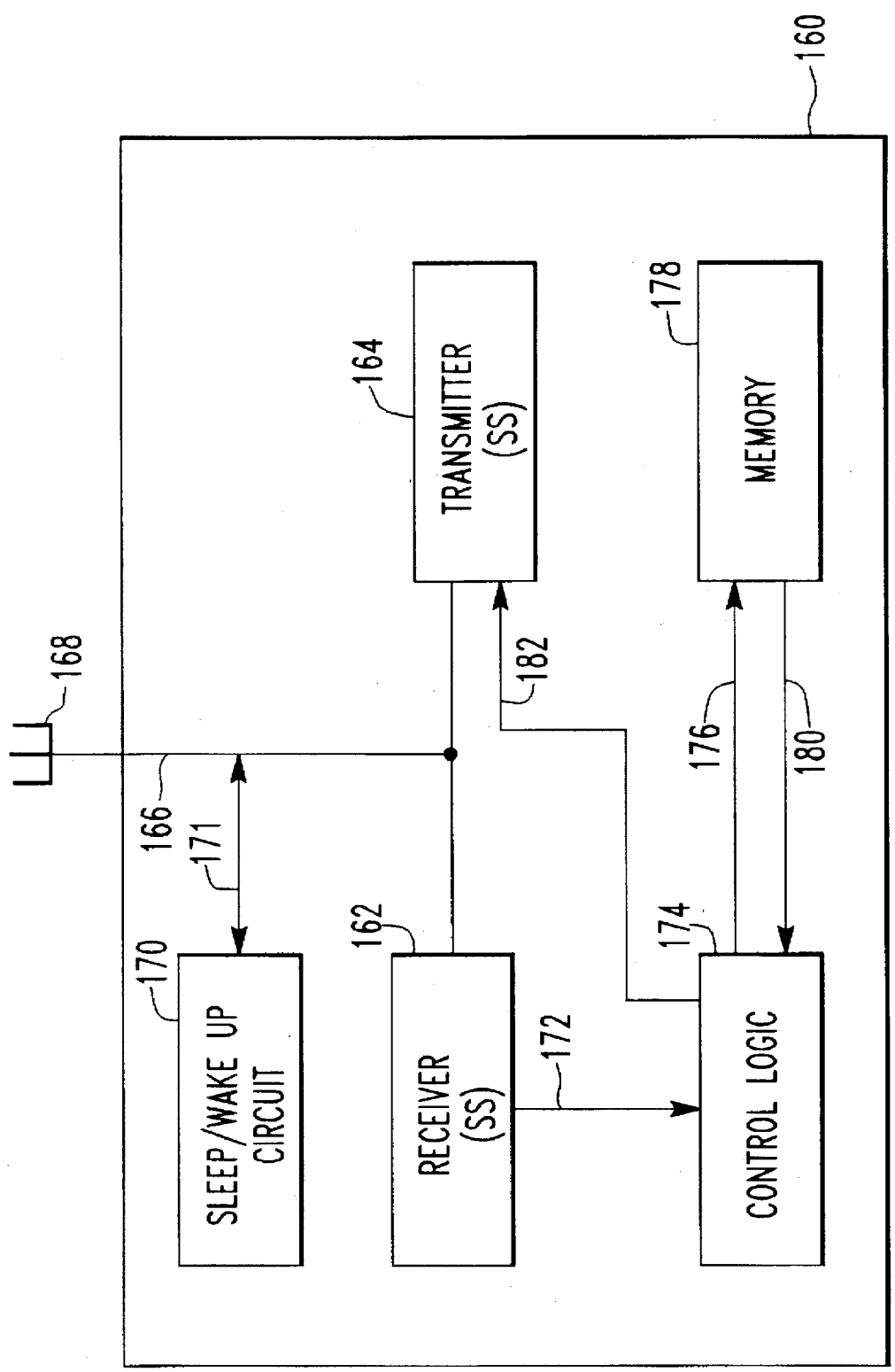

1

METHOD OF FORMING GUARD RINGED SCHOTTKY DIODE

BACKGROUND OF THE INVENTION

1. Field of the Invention

The present invention is directed generally to solid state fabrication methods used to fabricate Schottky diodes, and more particularly to the fabrication of a Schottky diode having a guard ring.

2. Description of the Background

Schottky diodes had been used for many years in the semiconductor industry as, for example, clamps and rectifiers. A Schottky diode is formed by the connection of a metal layer to a doped semiconductor layer. The Schottky barrier is formed at the junction of the metal layer and the doped semiconductor layer.

It is well known in the art that Schottky diodes tend to have poor reverse leakage characteristics. To improve the leakage characteristics, a guard ring of the opposite polarity carrier is often used. However, the fabrication of such a guard ring typically requires an additional masking step. Also, the guard ring takes up space such that Schottky diodes having guard rings require more surface space than Schottky diodes not having such guard rings.

U.S. Pat. No. 5,418,185 discloses a method of making Schottky diodes with guard rings. That patent recognizes that, due to the radius of curvature affects at the edges of the Schottky barrier, a field quickly builds up when a reverse bias is applied. That leads to a low breakdown voltage and poor leakage characteristics. That patent further recognizes that breakdown voltage has traditionally been improved by placing a defused p-type guard ring around the Schottky barrier, with the p-type guard ring short circuited to the anode of the Schottky diode. That relieves the field, giving rise to a higher reverse voltage breakdown. In the aforementioned patent, a guard ring in the semiconductor layer is formed adjacent to the Schottky barrier, but is separated from the conductive contact by a portion of the semiconductor layer. No direct electrical path exists between the guard ring and the conductive contact.

Notwithstanding the efforts directed toward producing Schottky diodes with better performance characteristics, the need exists for a fabrication technique which allows a guard ringed Schottky diode of the same size as a non-guard ringed Schottky diode to be fabricated without requiring an additional mask step.

SUMMARY OF THE INVENTION

The present invention is directed to a method of forming a guard ring for a Schottky diode and a Schottky diode produced by the method. The method is comprised of the steps of forming anode and cathode contact openings. A layer of doped material is deposited and etched to create spacers in the anode and cathode openings. The outdiffusion of dopant from the spacers is controlled so as to form a guard ring in the well without affecting the active area. The method can be used to create a p-type guard ring in an n-well or an n-type guard ring in a p-well.

A Schottky diode having a guard ring constructed according to the teachings of the present invention is constructed on a substrate having an active area interspersed with regions of field oxide formed in a well. A layer of over-glass covers the substrate. An anode contact opening extends through the layer of over-glass to one of the active area or the well. A cathode contact opening extends through the layer of over-glass to the other of the active area or the well. Spacers of doped material are positioned in the anode and cathode openings. A guard ring, positioned in the well, is formed by the outdiffusion of dopant from one of the spacers into the well. Schottky barrier material is positioned at the bottom of the anode and cathode contact openings. A conductive material substantially fills the anode and cathode contact openings to complete the diode.

Diodes constructed according to the teachings of the present invention do not require more space than diodes not having guard rings. The method of the present invention may be practiced to fabricate guard ringed diodes without the necessity of a separate masking step for forming the guard ring. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein:

FIG. 6 illustrates a system in which the present invention may be employed.

DESCRIPTION OF THE PREFERRED EMBODIMENTS

Figure 1:
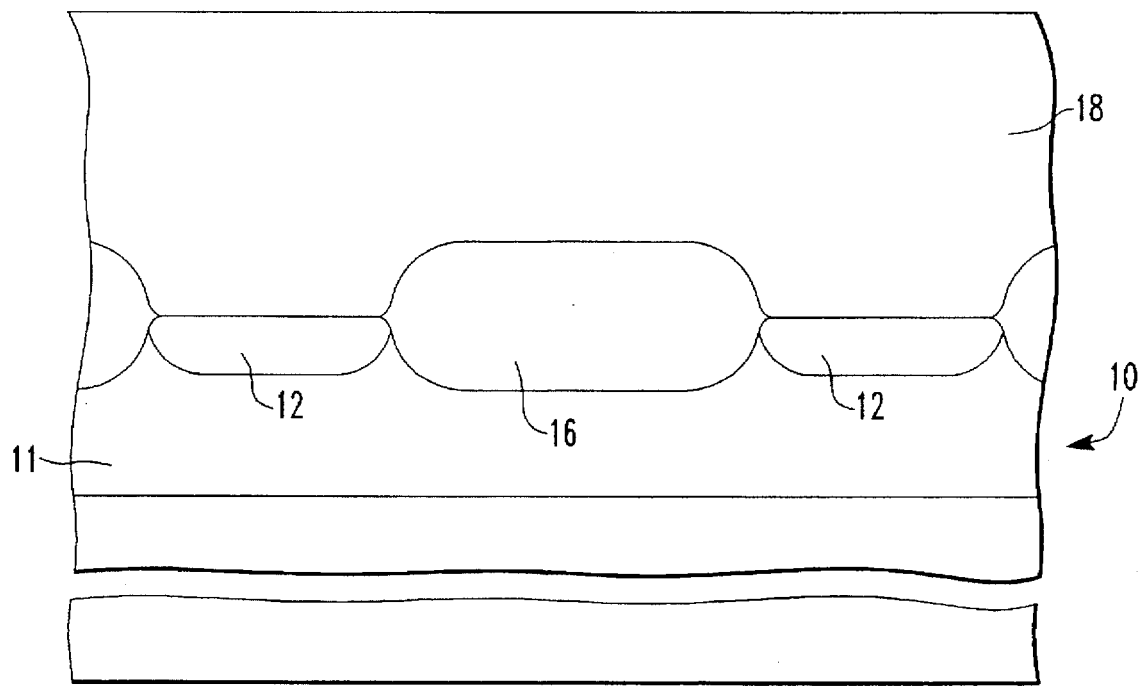
FIG. 1 illustrates a portion of a substrate in which field oxide regions separate active area regions fabricated in a well.

In FIG. 1 a portion of a p-type substrate 10 is illustrated. Fabricated in the p-type substrate 10 is an n-well 11. Within n-well 11 is fabricated an $n^+$ active area 12. Interspersed within the $n^+$ active area 12 are field oxide regions 16. The entire substrate is covered by a layer of overglass 18.

The reader should recognize that the method steps used to produce a substrate as shown in FIG. 1 are known and are conventional in the art. For that reason, the steps necessary to configure the substrate as shown in FIG. 1 are not described. Furthermore, the reader should recognize that all of the material types can be reversed. That is, the substrate 10 can be an n-type substrate with a p-well and a $p^+$ active area.

Figure 2:
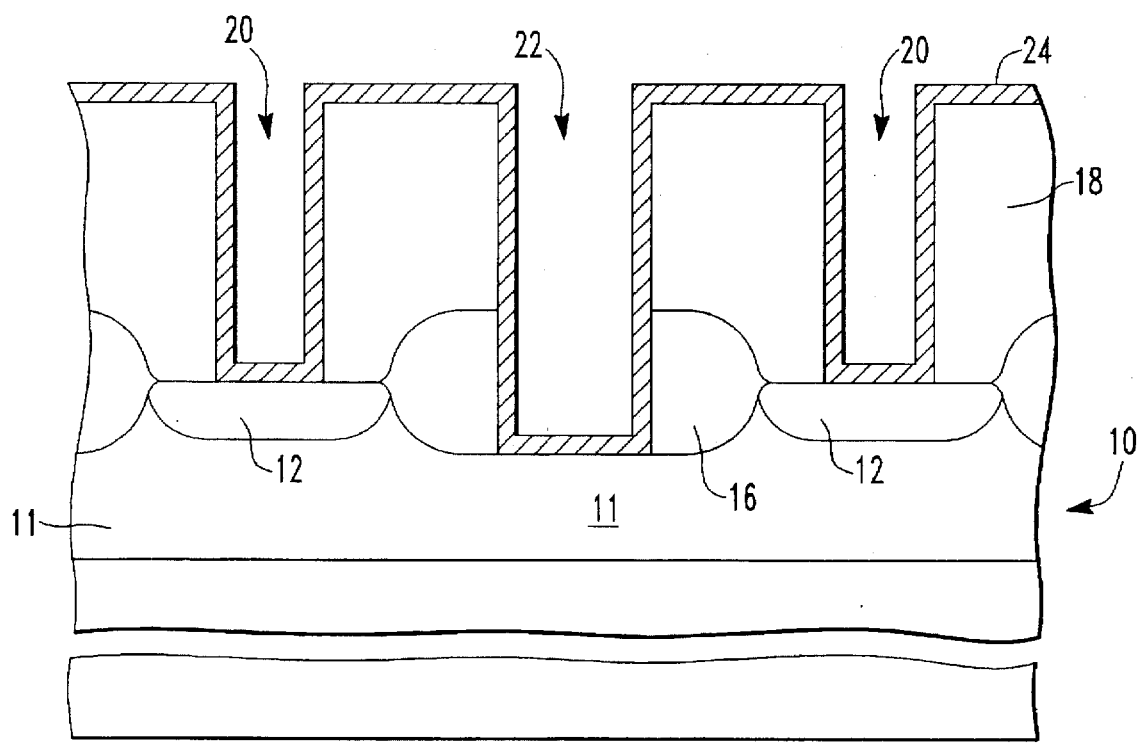
FIG. 2 illustrates the portion of the substrate shown in FIG. 1 with contact openings formed and an in situ doped layer of polysilicon deposited over the wafer.

In FIG. 2, an opening 20 is formed in the overglass 18 which extends through the layer of overglass 18 to the active area 12. At the same time that the opening 20 is formed, an opening 22 is formed which extends through the layer of overglass 18 to the n-well 11. The opening 20 will eventually form the anode of a Schottky diode constructed according to the teachings of the present invention, while the opening 22 will form the cathode of the diode. If the materials are reversed such that the active area 12 is a $p^+$ active area in a p-well 11, then the opening 20 will be where the cathode is formed and the opening 22 will be where the anode is formed.

After the anode and the cathode openings are formed, a layer of doped material 24 is deposited. If the n-well is doped at a concentration of $8 \times 10^{16}$ to $1 \times 10^{17}$, and the $n^+$ active area is doped at a concentration of $5 \times 10^{20}$, then the layer 24 may be, for example, 500 angstroms of insitu born doped polysilicon doped at a concentration of $5 \times 10^{17}$ to $1 \times 10^{20}$ boron atoms/cm$^3$. The boron dopant may be any boron containing source compatible with silicon deposition such as diborane. In insitu doping is preferred, but not required, because the dopant is incorporated into the polysilicon as the polysilicon is deposited such that the polysilicon is uniformly doped throughout. Of course, if the well 11 were constructed of p-type material and the active area was a $p^+$ active area, then the dopant would be an n-type dopant.

Figure 3:
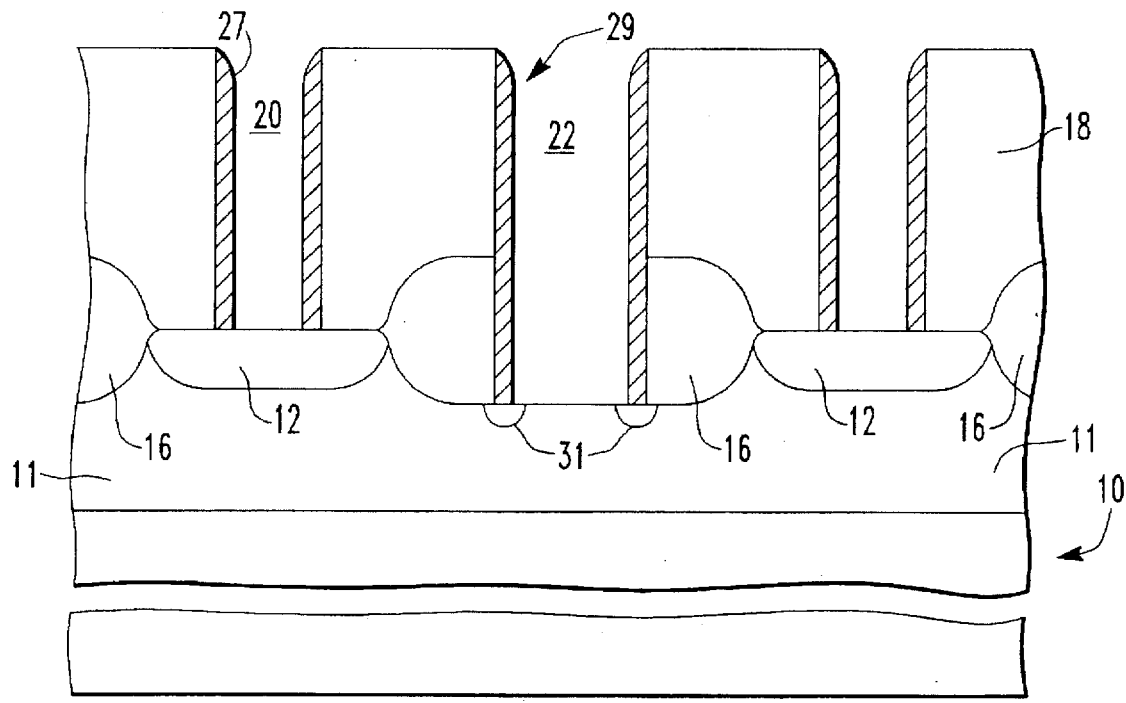
FIG. 3 illustrates the portion of the substrate shown in FIG. 2 after the layer of polysilicon has been etched to leave spacers in the openings and the wafer has been treated to allow out diffusion from the spacer to form a guard ring.

In FIG. 3, the polysilicon layer 24 has been etched to leave a spacer 27 in the opening 20 and a spacer 29 in the opening 22. The etch may be an anisotropic etch which leaves the spacers 27, 29 on the contact opening sidewall but removes the doped polysilicon from the bottom of the contact openings.

The substrate is then heated at a sufficient temperature and time to allow the dopant carried by the spacer 29 to outdiffuse to form a guard ring 31. The outdiffusion of the dopant from the spacer 29 is sufficient to form the guard ring 31 in lightly doped n-type well 11 but is insufficient to adversely affect the more heavily doped $n^+$ active area 12.

Control of the outdiffusion process is important. The concentration of dopant in the spacers 27, 29 and thickness of the spacers must be considered together with the concentration of dopant in the n-well 11 and the concentration of the dopant in the $n^+$ active area. The outdiffusion may be performed by a thermal annealing process during which the time and temperature are controlled so that a sufficient guard ring 31 is formed without adversely affecting the performance of active area 12. For example, given the aforementioned dopant concentrations, the substrate 10 may be subject to a rapid thermal anneal of approximately twenty to thirty seconds at 950° C. to allow sufficient outdiffusion to form ring 31 without adversely affecting the characteristics of $n^+$ type active area 12.

Figure 4:
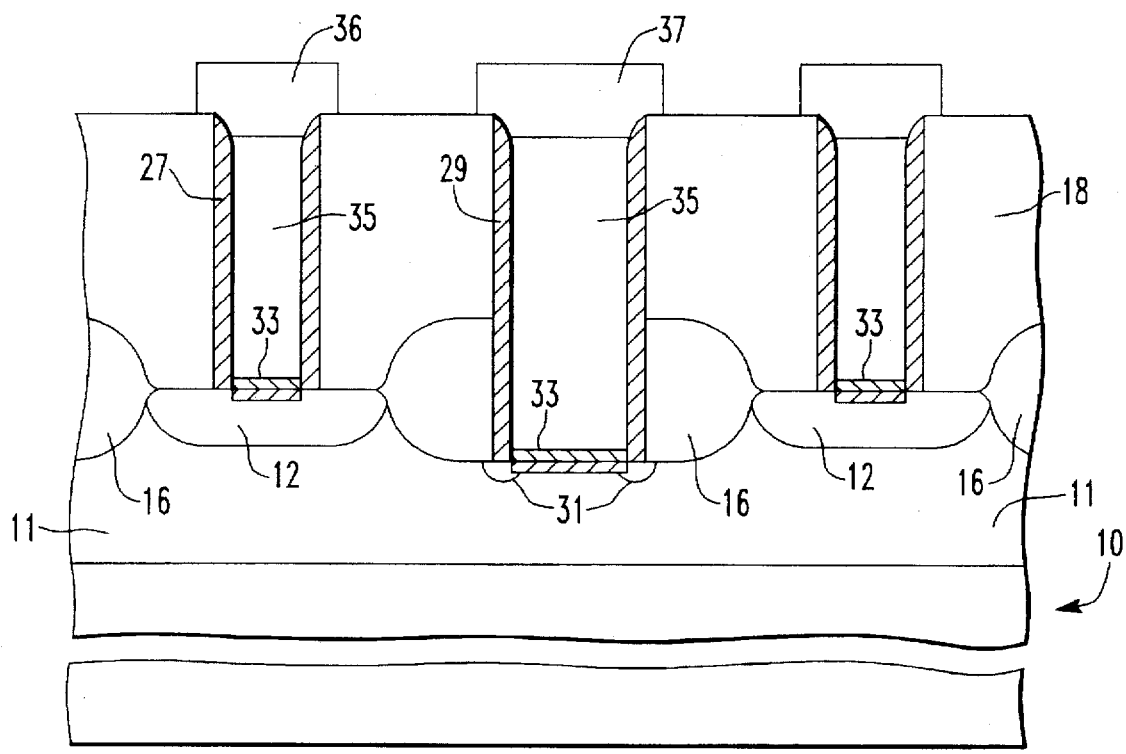
FIG. 4 illustrates the portion of the substrate shown in FIG. 3 with the diode completed.
Figure 5:
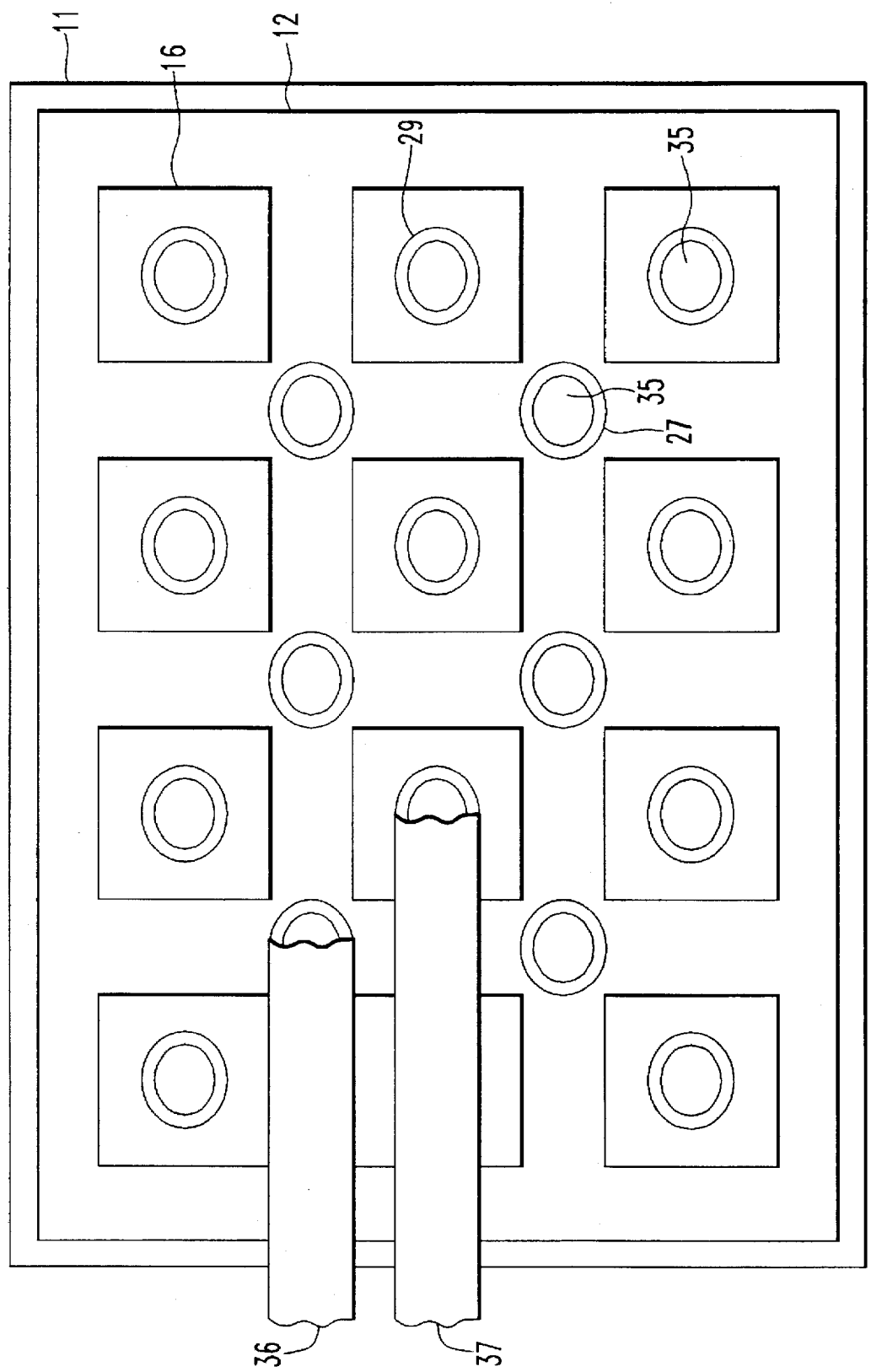
FIG. 5 is a top view of a Schottky diode array.

Turning to FIG. 4, the fabrication of the Schottky diode is completed in a conventional manner. A Schottky barrier metal or silicide is deposited at the bottom of the contact openings 20 and 22. A conductive material, such as metal 35, substantially fills the remainder of the openings 20 and 22. The metal 35 is in electrical contact with conductors 36, 37. The conductors 36, 37 are best seen in FIG. 5 which is a top view looking down onto an array 40 of Schottky diodes. The size of the array 40 is determined by the application.

The area of each Schottky diode is determined by the size of the contact openings 20 and 22 and the thickness of the spacer 29 used to form the guard ring 31. Thus, the size of the Schottky diode is not adversely affected by the guard ring 31. Furthermore, all the contact openings are formed at the same time, and all the spacers are formed at the same time. Thus, no additional process steps are needed inasmuch as the anode and cathode openings are processed in the same manner. That allows the method of the present invention to be carried out in an economical manner which requires minimal changes to existing processes for fabricating Schottky diodes.

The present invention is also directed to a Schottky diode constructed according to the method of the present invention. Such a diode, as shown in FIGS. 4 and 5, is characterized by the spacers 27 and 29 which remain in the finished product.

Referring now to FIG. 6, the rectangular outer boundary 160 in this figure defines the active area on an integrated circuit chip in which a radio frequency identification transceiver circuit has been formed. The circuit disclosed in FIG. 6 is one example of where the Schottky diodes of the present invention may be employed. Within the chip active area 160 there is provided an RF receiver stage 162 and an RF transmitter stage 164, both connected through a common line or connection 166 to an off-chip antenna 168. A sleep-wake up circuit 170 is also connected via line 171 to the antenna 168 and operates in response to signals received from the antenna 168 to activate the necessary remaining circuitry and stages on the chip.

The receiver 162 is connected through a line 172 to a control logic stage 174, and a first output line 176 from the control logic stage 174 is connected as an input to a memory stage 178. A return output line 180 from the memory stage 178 connects to the control logic stage 174, and a second output line 182 from the control logic stage 174 connects as a second input to the transmitter 164 for providing memory or stored input data to the transmitter 164 via control logic stage 174.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of forming a guard ring for a Schottky diode having a well and an active area, comprising the steps of:
   forming anode and cathode contact openings;
   depositing a layer of doped material;
   etching the layer of doped material to create spacers in the anode and cathode openings; and
   controlling the outdiffusion of dopant from the spacers so as to form a guard ring in the well without affecting the active area.

2. The method of claim 1 wherein said step of depositing a layer of doped material includes the step of depositing a layer of p-type insitu doped material.

3. The method of claim 2 wherein said step of controlling the outdiffusion includes the step of controlling the outdiffusion so as to form a p-type guard ring in an n-type well.

4. The method of claim 1 wherein said step of depositing a layer of doped material includes the step of depositing a layer of n-type insitu doped material.

5. The method of claim 4 wherein said step of controlling the outdiffusion includes the step of controlling the outdiffusion so as to form an n-type guard ring in a p-type well.

6. The method of claim 1 wherein said step of controlling the outdiffusion of dopant includes the step of thermal annealing at a temperature for a time.

7. The method of claim 6 wherein the annealing temperature and the annealing time are determined by the concentration of dopant in the doped layer, the concentration of dopant in the well, and the concentration of dopants in the active area.

8. A method of forming a Schottky diode having a guard ring, comprising the steps of:
   forming an anode contact opening extending to one of an active area and a well and a cathode contact opening extending to the other of the active area and the well;
   depositing a layer of doped material;
   etching the layer of doped material to create spacers in the anode and cathode openings;
   controlling the outdiffusion of dopant from the spacers so as to form a guard ring in the well without affecting the active area;

depositing a Schottky barrier material at the bottom of the anode and cathode contact openings; and substantially filling the anode and cathode contact openings with a conductive material.

9. The method of claim 8 wherein said step of depositing a layer of doped material includes the step of depositing a layer of n-type insitu doped material.

10. The method of claim 9 wherein said step of controlling the outdiffusion includes the step of controlling the outdiffusion so as to form an n-type guard ring in a p-type well.

11. The method of claim 8 wherein said step of depositing a layer of doped material includes the step of depositing a layer of p-type insitu doped material.

12. The method of claim 11 wherein said step of controlling the outdiffusion includes the step of controlling the outdiffusion so as to form a p-type guard ring in an n-type well.

13. The method of claim 12 wherein said step of depositing a layer of insitu doped material includes the step of depositing a layer of insitu doped polysilicon doped at a concentration of between approximately $5 \times 10^{17}$ and $1 \times 10^{20}$ boron atoms/cm$^3$.

14. The method of claim 13 wherein said step of depositing a layer of insitu doped polysilicon includes the step of depositing a layer of insitu doped polysilicon approximately 500 angstroms thick.

15. The method of claim 14 wherein said step of controlling the outdiffusion of dopant includes the step of thermal annealing at a temperature for a time.

16. The method of claim 15 wherein said step of thermal annealing for a temperature for a time includes the step of thermal annealing at approximately 950° C. for approximately twenty to thirty seconds.

17. The method of claim 8 wherein said step of etching the layer of doped material includes the step of anisotropically etching the layer of doped material.

* * * * *